United States Patent [19]
Lubeck et al.

[11] Patent Number: 5,367,645
[45] Date of Patent: Nov. 22, 1994

[54] MODIFIED INTERFACE FOR PARALLEL ACCESS EPROM

[75] Inventors: Paul R. Lubeck, San Jose, Calif.; Wallace L. Breinholt, South Jordan, Utah

[73] Assignee: National Semiconductor Corporation, Santa Clara, Calif.

[21] Appl. No.: 897,913

[22] Filed: Jun. 12, 1992

[51] Int. Cl.$^5$ ............... G11C 7/00; G06F 13/00
[52] U.S. Cl. ................... 395/325; 365/194; 395/425; 364/244; 364/244.6; 364/DIG. 1; 364/260; 326/21
[58] Field of Search ........... 395/425, 400, 800, 275, 395/775, 325; 365/189.01, 194, 238.5; 307/443

[56] References Cited

U.S. PATENT DOCUMENTS

| | | | |
|---|---|---|---|
| 4,159,520 | 6/1979 | Prioste | 364/200 |
| 4,303,991 | 12/1981 | Moore | 364/900 |
| 4,661,980 | 4/1987 | Byram | 380/46 |
| 4,882,507 | 11/1989 | Tatsumi et al. | 307/443 |
| 4,975,593 | 12/1990 | Kurakazu et al. | 307/269 |
| 5,047,922 | 9/1991 | Borkar | 364/200 |
| 5,097,446 | 3/1992 | Shoji et al. | 365/195 |
| 5,113,373 | 5/1992 | Lee | 365/227 |
| 5,134,583 | 6/1992 | Matsuo et al. | 365/200 |

Primary Examiner—Gopal C. Ray
Attorney, Agent, or Firm—Limbach & Limbach

[57] ABSTRACT

Output interface circuitry utilizable for controlling the data output of an EPROM device includes data hold circuitry that responds to the deactivation of an externally-provided output enable signal by providing a predetermined data hold time at the data output. During the predetermined data hold time, data at the EPROM's data input is guaranteed valid. Data float circuitry connected to the data hold circuitry controls the turn-off time of the data output after deactivation of the output enable signal.

4 Claims, 2 Drawing Sheets

MODIFIED INTERFACE FOR PARALLEL ACCESS EPROM

BACKGROUND OF INVENTION

1. Field of the Invention

The present invention relates to electrically programmable read only memory (EPROM) devices and, in particular, to an EPROM data output interface that eliminates the need for back-end wait states and data hold logic when used with high speed microprocessors.

2. Discussion of the Prior Art

When EPROMs were originally developed, they were used in applications that were based either on single chip microcontrollers and microcomputers or on larger multi-chip computer systems. At that time, a standard output interface was adopted for transferring data from EPROM storage onto the system data bus. Although the standard interface still provides efficient interfacing with existing low-performance, single-chip microcontrollers, a significant mismatch has developed between the EPROM and high-speed, single-chip microprocessors, such as Motorola's MC68030/MC68040 and Intel's I386/I486 machines.

Existing EPROMs are parallel access memories with either 8-bit or 16-bit data word width and control signals comprising Chip Enable $\overline{CE}$, Output Enable $\overline{OE}$, and other signals that control programming, supply power and data direction. Since an EPROM is normally used only in the READ (data output) mode, only the signals associated with the READ mode will be defined for purposes of this discussion.

FIG. 1 shows a timing diagram of an existing EPROM in the read mode. In FIG. 1, hold time $t_{DH}$ is the time during which data is guaranteed valid after either the Chip Enable $\overline{CE}$ signal or the Output Enable $\overline{OE}$ signal returns to an inactive (high) state. For existing EPROMs, the industry standard guarantees a hold time $t_{DH}=0$ nanoseconds. That is, according to the industry standard, as soon as either the Chip Enable or the Output Enable signal goes inactive, data at the outputs is assumed to be invalid.

Furthermore, after the Chip Enable signal or the Output Enable signal goes inactive, a float time $t_{DF}$ is required until the data lines are guaranteed to be in the High-Z (impedance) state, thus insuring that the data bus is available for use by the associated microprocessor. Existing EPROMs guarantee a float time of no less than 30 seconds. For high-speed microprocessors (faster than 20 MHz clock rate), this means that "wait states" are required at the end of an EPROM access to insure bus availability. This slows down system operation.

FIG. 2 shows conventional data output interface circuitry for controlling EPROM read operations. In the FIG. 2 circuitry, although the primary purpose of resistors $R_A$ and $R_B$ is to control the turn-on rate at the data outputs, these resistors also slow down the turn-off rate, thus increasing the float time $t_{DF}$. As stated above, the FIG. 2 circuit makes no provision for a hold time $t_{DH}$ greater than zero.

An alternative prior art implementation places resistors $R_A$ and $R_B$ internal to the NAND and NOR gates such that only the turn-on rate is controlled and the turn-off rate is faster. The disadvantage of this approach is that turn-on control is not very exact.

SUMMARY OF THE INVENTION

The present invention provides circuitry for controlling the data output interface of an electrically programmable read only memory (EPROM) device. The data output interface is controlled by the activation and deactivation of an output enable signal. The circuitry includes data hold means for providing a predetermined hold time $t_{DH}$ following the deactivation of the output enable signal. During the predetermined data hold time $t_{DH}$, data at the data output of the EPROM is guaranteed valid. The circuitry also includes data float means for controlling the float time $t_{DF}$ of the data output after the deactivation of the output enable signal, thereby increasing the speed with which the data outputs return to the High-Z (impedance) state.

A better understanding of the features and advantages of the present invention will be obtained by reference to the following detailed description and accompanying drawings which set forth an illustrative embodiment in which the principals of the invention are utilized.

A DETAILED DESCRIPTION OF THE INVENTION

As stated above, several changes to the standard EPROM interface must be provided to improve the efficiency of the EPROM/microcomputer interface while maintaining compatibility with existing standard EPROMs. The resulting output interface circuitry, described below, offers a better EPROM to microprocessor users while continuing to offer the standard EPROM to other users without requiring additional devices to be manufactured.

To make an EPROM interface to high performance (faster than 20 MHz clock rate) microprocessors, two changes to the conventional interface standard are necessary. These changes eliminate the need for "wait states" at the end of an EPROM access cycle. Elimination of wait states speed up system operation and eliminates circuitry from the system design, thereby reducing cost and size.

Figure 3:
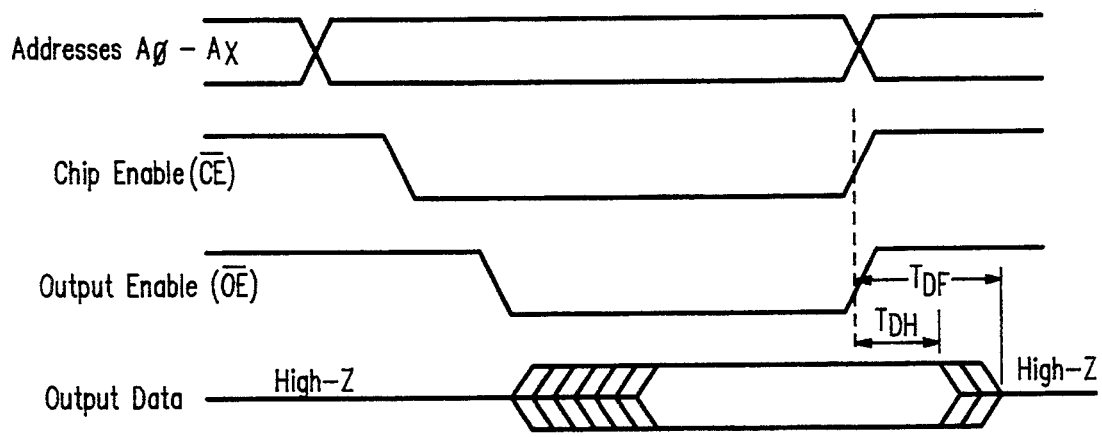
FIG. 3 is a timing diagram illustrating signal conditions of the data output interface of an EPROM utilizing output interface circuitry in accordance with the present invention.

With reference to FIG. 3, the first interface change is to reduce the $t_{DF}$ to a maximum of 25 nanoseconds (for microprocessor clock rates up to 40 MHz) by guaranteeing that the data outputs are in the High-Z (impedance) state within 25 nanoseconds after deactivation of the EPROM's output enable signal. This releases the microprocessor data bus, thereby allowing the bus to be used by the microprocessor to begin its next cycle.

With continuing reference to FIG. 3, the second interface change is to provide a data hold time $t_{DH}$ that matches or exceeds the needs of the associated microprocessor. Existing EPROMs guarantee valid data only as long as the output enable signal is asserted. A seven nanosecond data hold time $t_{DH}$ meets the needs of the microprocessors with clock rates up to 40 MHz.

Figure 1:
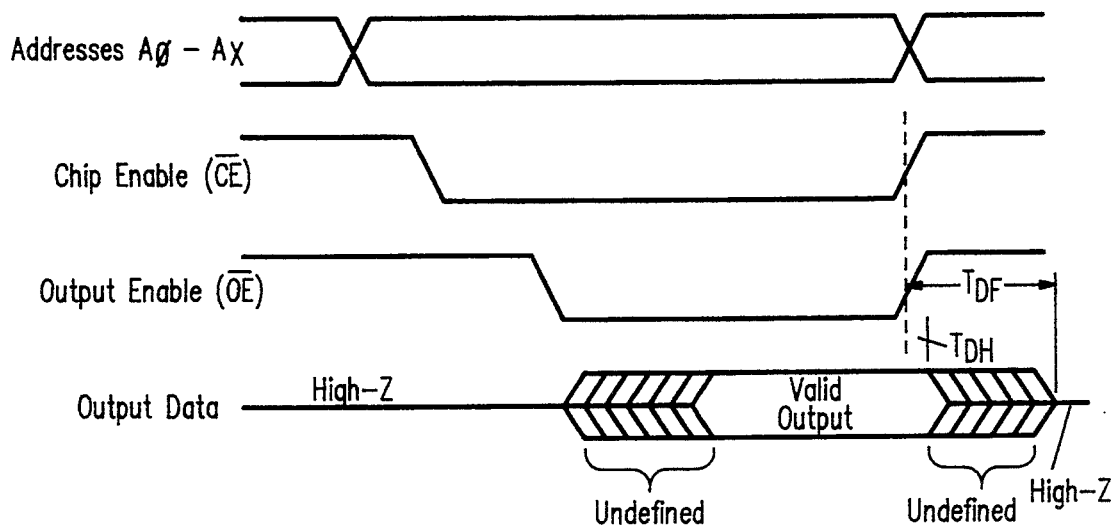
FIG. 1 is a timing diagram illustrating the signal waveforms at the data output interface of a conventional EPROM in the READ mode.
Figure 2:
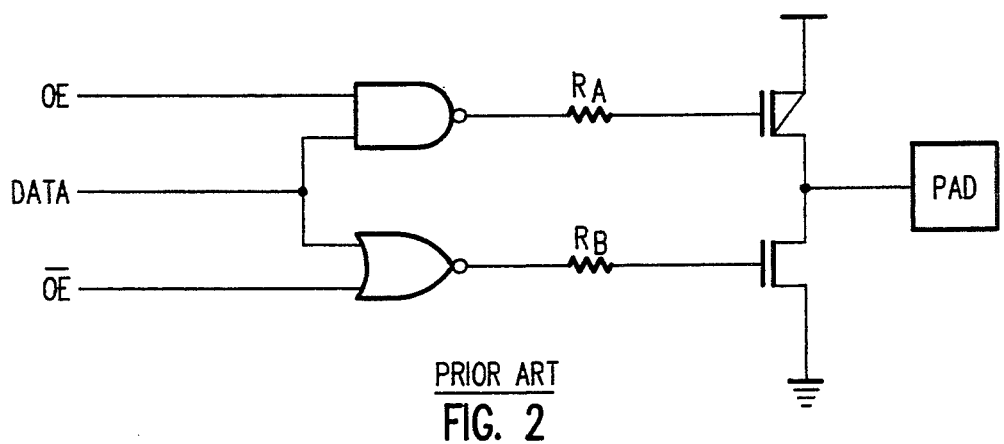
FIG. 2 is a logic diagram illustrating conventional circuitry for controlling the turn-on and turn-off time of the data output interface of a conventional EPROM.
Figure 4:
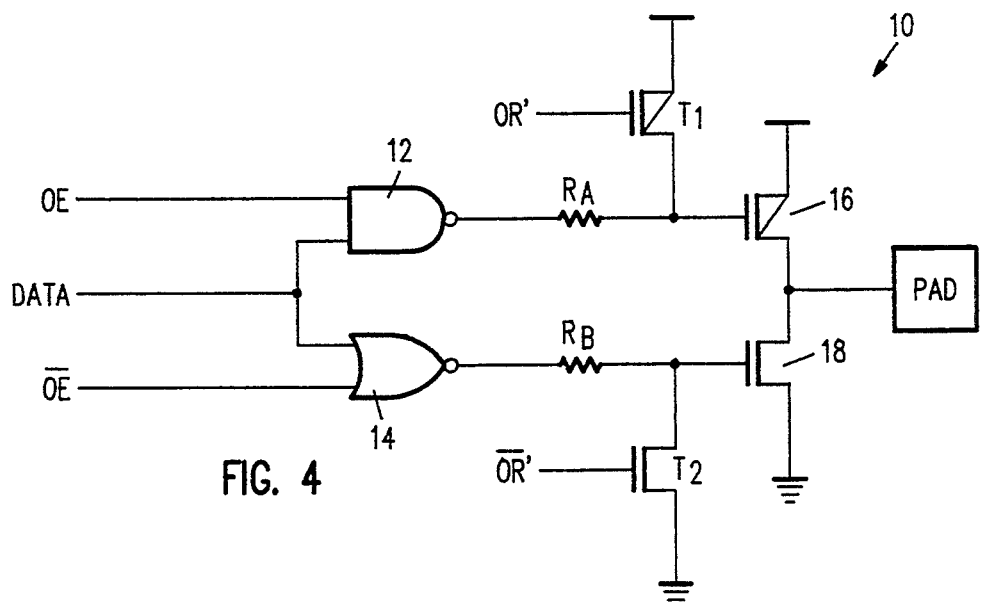
FIG. 4 is a schematic diagram illustrating circuitry for controlling the hold time $t_{DH}$ and float time $t_{DF}$ of an EPROM utilizing output interface circuitry in accordance with the present invention.

FIG. 4 shows an output interface circuit 10 that reduces the data float time $t_{DF}$ in accordance with the present invention. The FIG. 4 circuit 10 is similar to the FIG. 2 prior art circuit in that it utilizes the output of a NAND gate 12 and the output of a NOR gate 14 to drive an output p-channel pull-up transistor 16 and an output n-channel pull-down transistor 18, respectively. As in the prior art circuit, resistors $R_A$ and $R_B$ are sized to control the turn-on time of the data output interface. In accordance with the present invention, resistors $R_A$ and $R_B$ are bypassed by connecting a feed-forward p-channel transistor T1 between the gate of pull-up transistor 16 and the positive supply and a feed forward n-channel transistor T2 between the gate of pull-down transistor 18 and ground. Transistors $T_1$ and $T_2$ are driven by signals OR' and $\overline{OR}'$, respectively, the derivation of which will be explained below. By simultaneously turning these two devices $T_1$ and $T_2$ on, the turn-off float time $t_{DF}$ can be controlled more accurately.

Figure 5:
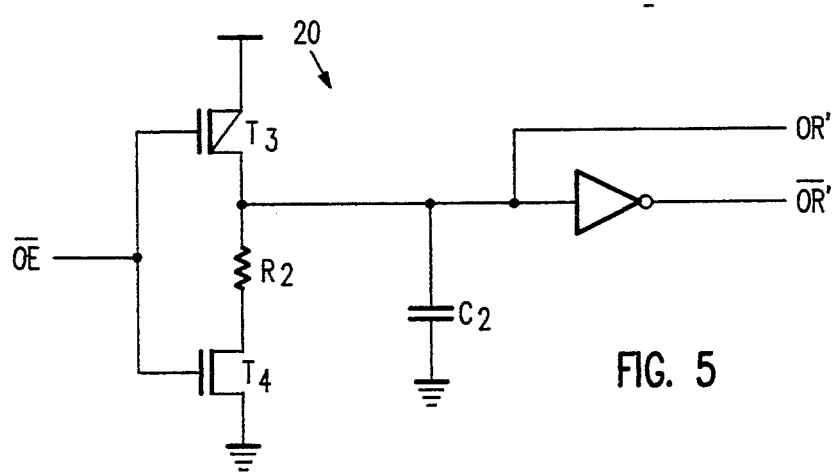
FIG. 5 is a schematic diagram illustrating circuitry for controlling the hold time $t_{DH}$ of an EPROM utilizing output interface circuitry in accordance with the present invention.

Referring to FIG. 5, an RC network 20 is utilized to provide the OR' and $\overline{OR}'$ drive signals to transistors $T_1$ and $T_2$, respectively, while establishing a hold time of predetermined duration. That is, resistor R1 and capacitor C2 are sized to provide a predetermined guaranteed data hold time $t_{DH}$ following the deactivation of the output enable signal $\overline{OE}$.

Referring to FIG. 5, when the output enable signal $\overline{OE}$ is active (low), P-channel transistor $T_3$ of the RC network 20 is on and n-channel transistor $T_4$ is off. Thus, the outputs OR' and $\overline{OR}'$ of the network 20 are high and low, respectively. Referring back to FIG. 4, with signals OR' and $\overline{OR}'$ respectively high and low, transistors $T_1$ and $T_2$ are both off. At the same time, both NAND 12 gate and NOR gate 14 are enabled, allowing the input DATA signal to control the output PAD.

However, referring to FIG. 5 again, when the output enable signal $\overline{OE}$ gives inactive (high), transistor $T_3$ turns off and transistor $T_4$ turns on. The $R_2C_2$ network holds output OR' high ($\overline{OR}'$ low) for a time until capacitor $C_2$ discharge to ground through transistor $T_4$. This time, which constitutes the hold time $t_{DH}$ of the output interface, is determined by the sizing of resistor $R_2$ and capacitor $C_2$. After the discharge of capacitor $C_2$, signal OR' goes low and signal $\overline{OR}'$ goes high.

Referring back to FIG. 4, when the output OR' of the RC network goes low ($\overline{OR}'$ high), then both transistor $T_1$ and transistor $T_2$ turn on, forcing the output PAD to the High-Z (impedance) state. Again, this float time $t_{DF}$ is determined by the sizing of resistor $R_2$ and capacitor $C_2$.

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. Output interface circuitry utilizable for controlling the data output of an electrically programmable read only memory (EPROM) device, the data output of the EPROM device being responsive to transitions in the logic state of an externally-provided output enable signal, the output interface circuitry comprising:
   (a) a first data transfer circuit for transferring a data input signal to the data output of the EPROM device when the output enable signal is in an active logic state and the data input signal is logic high;
   (b) a second data transfer circuit for transferring the data input signal to the data output of the EPROM device when the output enable signal is in an active logic state and the data input signal is logic low;
   (c) data float switching means connected to the first and second data transfer circuits and responsive to a switching signal for forcing the data output of the EPROM device to a high impedance state within a specified data float time $t_{DF}$ after the output enable signal transitions from the active logic state to an inactive logic state; and
   (d) data hold means responsive to the transition of the output enable signal from the active logic state to the inactive logic state for providing the switching signal to the data float switching means a specified data hold time $t_{DH}$ after the transition of the output enable signal.

2. Output interface circuity as in claim 1 wherein the active logic state of the output enable signal is a logic low state.

3. Output interface circuitry utilizable for controlling the data output of an electrically programmable read only memory (EPROM) device, the data output of the EPROM device being responsive to transitions int he logic state of an externally-provided output enable signal, the output interface circuitry comprising:
   (a) a logic high data path that includes
      (i) a p-channel pull-up transistor having its source connected to a positive supply and its drain connected to the data output of the EPROM device, and
      (ii) a NAND gate connected to receive a signal having a logic state that is the compliment of the logic state of the output enable signal and a data input signal as inputs, the output of the NAND gate connected to the gate of the p-channel pull-up transistor via a high data path resistor
      whereby the logic high data path transfers the data input signal to the data output of the EPROM device when the output enable signal is in a logic low state and the data input signal is in a logic high state;
   (b) a logic low data path that includes
      (i) an n-channel pull-down transistor having its source connected to ground and its drain connected to the data output of the EPROM device; and
      (ii) a NOR gate connected to receive the output enable signal and the data input signal as inputs, the output of the NOR gate connected to the gate of the n-channel pull-down transistor via a low data path resistor
      whereby the logic low data path transfers the data input signal to the data output of the EPROM device when the output enable signal is in a logic low state and the date input signal is in a logic low state;

(c) data hold means responsive to transition of the output enable signal from the logic low state to a logic high state for providing a logic low switching signal and a logic high switching signal a specified data hold time $t_{DH}$ after the transition of the output enable signal;

(d) a p-channel feedback transistor having its source connected to the positive supply, its drain connected to the gate of the p-channel pull-up tansistor, and its gate connected to receive the logic low switching signal; and (e) a n-channel feedback transistor having its source connected to ground, its drain connected to the gate of the n-channel pull-down transistor, and its gate connected to receive the logic high switching signal;

whereby the data output of the EPROM device is forced to a high impedance state within a specified data float time $t_{DF}$ after the transition of the output enable signal.

4. Output interface circuitry as in claim 3 wherein the data hold means comprises:

(a) an invertor;

(b) a p-channel input transistor having its source connected to the positive supply, and its drain connected to the input of the invertor and its gate connected to receive the output enable signal;

(c) an n-channel input transistor having its source connected to ground, its drain connected to the input of the invertor via a data hold resistor, and its gate connected to receive the output enable signal; and (d) a data hold capacitor connected between the input of the invertor and ground whereby the input to the invertor serves as the logic low switching signal and the output of the invertor serves as the logic high switching signal.

* * * * *